United States Patent
Matsuura

(10) Patent No.: US 6,625,628 B1
(45) Date of Patent: Sep. 23, 2003

(54) METHOD AND APPARATUS FOR DIGITAL FILTER

(75) Inventor: Hideki Matsuura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/534,994

(22) Filed: Mar. 27, 2000

(30) Foreign Application Priority Data

Mar. 30, 1999 (JP) .......................................... 11/089635

(51) Int. Cl.[7] .............................................. G06F 17/10
(52) U.S. Cl. ...................................... 708/300; 708/301
(58) Field of Search ................................ 708/300, 301, 708/314, 316

(56) References Cited

U.S. PATENT DOCUMENTS

| | | | | |
|---|---|---|---|---|
| 4,811,262 A | * | 3/1989 | White ........................ | 370/335 |
| 4,953,118 A | * | 8/1990 | Gockler ...................... | 708/300 |
| 4,965,536 A | * | 10/1990 | Yoshida ...................... | 332/103 |
| 5,345,407 A | * | 9/1994 | Hostetler .................... | 714/708 |
| 5,392,230 A | * | 2/1995 | Christopher ................. | 375/295 |
| 5,483,552 A | * | 1/1996 | Shimazaki et al. ......... | 375/295 |
| 5,648,923 A | * | 7/1997 | Lane et al. .................. | 708/316 |
| 5,831,879 A | * | 11/1998 | Yom et al. ................... | 708/301 |
| 5,831,880 A | * | 11/1998 | Lee .............................. | 348/614 |

FOREIGN PATENT DOCUMENTS

JP         5-55875         3/1993

* cited by examiner

Primary Examiner—Tuan Q. Dam
Assistant Examiner—Chat C Do
(74) Attorney, Agent, or Firm—Witham, Curtis & Christofferson, PC

(57) ABSTRACT

A digital filter having a small amount of hardware is realized by constructing a cosine roll-off filter. In the filter the first and fifth multipliers and the second to fourth multipliers are respectively shared. Three selectors are provided corresponding to the multipliers, and coefficient groups ka1 to ka3, and kb1 and kb3 are inputted by the selectors to the corresponding multipliers by time sharing. The results of multiplications by the multipliers when the coefficient groups kb1 to kb3 are inputted, are added between corresponding multipliers by adders. A final output is derived from an output selector.

8 Claims, 7 Drawing Sheets

METHOD AND APPARATUS FOR DIGITAL FILTER

BACKGROUND OF THE INVENTION

1. Field of the Invention

The present invention relates to a digital filter and an operation method in the digital filter, and more particularly to a cosine roll-off filter and an operation method in the filter.

2. Description of the Prior Art

Generally, a cosine roll-off filter is used to adjust a rectangular wave so as to bring its waveform into a position corresponding to a multiple of the number of taps to prevent interference due to reflection when transmitting it.

FIG. 3 shows a configuration of a conventional digital filter. In the figure, a general 5-tap FIR-type filter is shown. Specifically, multipliers M1 to M5 are provided corresponding to coefficients C1 to C5 inputted from five taps, and outputs of the multipliers M1 to M5 are added by adders A1 to A4 to obtain a final output. Input data to the filter is successively sent to subsequent stages by four flip-flops (hereinafter simply referred to as F/F) 31 to 34.

Consider the use of the filter of FIG. 3 in a double sampling mode. For input data of D1, D2, D3, . . . , D5, a filter output is as shown below. That is, output Y1 by the double sampling and output Y2 obtained one half cycle later are as follows.

$$\text{Output } Y1 = D1 \times (C5+C4) + D2 \times (C3+C2) + D3 \times C1$$

$$\text{Output } Y2 = D1 \times C5 + D2 \times (C4+C3) + D3 \times (C2+C1) \quad (1)$$

Furthermore, when the filter is used as a cosine roll-off filter, since C5=C1 and C4=C2 are satisfied because of symmetry, the above expression (1) is replaced by:

$$\text{Output } Y1 = D1 \times (C1+C2) + D2 \times (C3+C2) + D3 \times C1$$

$$\text{Output } Y2 = D1 \times C1 + D2 \times (C3+C2) + D3 \times (C1+C2) \quad (2)$$

It is to be noted that the coefficients C1, (C1+C2), and (C2+C3) are common in both the expressions (1) and (2).

Accordingly, by sharing overlapping hardware portions in FIG. 3 so that tap coefficients da1, da2, and da3 are equal to C1+C2, C2+C3, and C1, respectively, a filter can be realized which is identical in function and about half in the number of components with respect to the FIR-type filter of the figure. The realized filter is shown in FIG. 4.

In the figure, with multipliers M1 to M3 provided corresponding to coefficients da1 to da3 inputted from three taps, outputs of the multipliers M1 to M3 are temporarily stored in F/Fs 41 to 44 and are added by adders A1 to A4. A final output is obtained by switching an output selector 40.

In FIG. 4, an operating speed and the number of components are significantly reduced by integrating tap coefficients between oversamplings, taking advantage of the fact that input data is unchanged for the duration of oversampling in the double sampling mode.

Furthermore, with the filter, the speed of the multipliers commonly considered to have the lowest operating speed may be half that of those in FIG. 3, contributing to speedup.

Next, consider quadruple sampling in the filter of FIG. 5. In FIG. 5, with multipliers M1 to M9 provided corresponding to coefficients C1 to C9 inputted from nine taps, outputs of the multipliers M1 to M9 are added by adders A1 to A8 to obtain a final output. Input data to the filter is successively sent to subsequent stages by four flip-flops (F/F) 51 5o 58.

In this case, as in the expressions (1) and (2), for input data of D1, D2, D3, and so forth, filter output is as shown below. Specifically, output Y1 by the quadruple sampling, output Y2 obtained a quarter of the cycle later, output Y3 obtained a quarter of that cycle later, and output Y4 obtained a quarter of that cycle later satisfy the following expression.

$$Y1 = D1 \times (C9+C8+C7+C6) + D2 \times (C5+C4+C3+C2) + D3 \times C1$$

$$Y2 = D1 \times (C9+C8+C7) + D2 \times (C6+C5+C4+C3) + D3 \times (C2+C1)$$

$$Y3 = D1 \times (C9+C8) + D2 \times (C7+C6+C5+C4) + D3 \times (C3+C2+C1)$$

$$Y4 = D1 \times C9 + D2 \times (C8+C7+C6+C5) + D3 \times (C4+C3+C2+C1) \quad (3)$$

where if C1=C9, C2=C8, C3=C7, and C4=C6, $$Y1 = D1 \times (C1+C2+C3+C4) + D2 \times (C2+C3+C4+C5) + D3 \times C1$$

$$Y2 = D1 \times (C1+C2+C3) + D2 \times (C3+C4+C4+C5) + D3 \times (C1+C2)$$

$$Y3 = D1 \times (C1+C2) + D2 \times (C3+C4+C4+C5) + D3 \times (C1+C2+C3)$$

$$Y4 = D1 \times C1 + D2 \times (C2+C3+C4+C5) + D3 \times (C1+C2+C3+C4) \quad (4)$$

Accordingly, as in FIG. 4, an FIR-type filter of FIG. 6 can be obtained by sharing overlapping hardware portions in FIG. 5.

Tap coefficients ka1, ka2, ka3, kb1, kb2, and kb3 are equal to C1+C2+C3+C4, C2+C3+C4+C5, C1, C1+C2+C3, C3+C4+C4+C5, and C1+C2, respectively.

In the figure, with multipliers M11 to M13 provided corresponding to coefficients ka1 to ka3 inputted from three taps, outputs of the multipliers M11 to M13 are temporarily stored in F/Fs 611 to 614 and are added by adders A11 to A14.

A counterpart of the same configuration described above is provided (portion indicated by dashed lines in the figure). Specifically, with multipliers M21 to M23 provided corresponding to coefficients kb1 to kb3 inputted from three taps, outputs of the multipliers M21 to M23 are temporarily stored in F/Fs 621 to 624 and are added by adders A21 to A24. A final output is obtained by switching an output selector 60.

In the example of FIG. 6, in 2N-times (N is a positive integer) sampling operations such as quadruple or octuple sampling, a filter can be realized which is half in the number of components and ½N in multiplier operating speed with respect to normal FIR-type filters.

As described above, the prior art is described in, e.g., Japanese Published Unexamined Patent Application No. Hei 5-55875. Such a digital filter is very efficiently configured. However, to realize, e.g., a 113-tap octuple-sampling filter would require 60 multipliers and 112 adders. An example of configuration in this case is shown in FIG. 7. In the figure, a number of multipliers, adders, and F/Fs (a block indicated by a rectangle in FIG. 7) are provided corresponding to incoming coefficients fa1 to faF and fb1 to fbF, and further, a counterpart of the same configuration is provided. Therefore, there is a drawback in that a huge amount of hardware is required. Concrete expressions of the coefficients fa1 to faF and fb1 to fbF are omitted.

There is also a problem that the operating speed of a filter depends on the switching speed of a selector at the last output stage. Specifically, the operating speed of an entire filter is determined by the operating speed of the selectors 40, 60, and the like of the last output stage, making it difficult to increase an operating speed.

SUMMARY OF THE INVENTION

The present invention has been made to solve the above-described drawbacks of the prior art, and its object is to offer a digital filter that has a small amount of hardware and a high operating speed, and an operation method in the digital filter.

A digital filter according to the present invention is a digital filter including multiplying means for multiplying input data and predetermined coefficients and adding means for adding the multiplication results, comprising: N (N is a natural number) multipliers in which, of first to (2N+1)-th multiplying means, M-th (M=1 to N) multiplying means and M-th (M=N+2 to 2N+1) multiplying means are shared, and to which the input data is inputted as one of inputs; N selectors, provided corresponding to the N multipliers, for inputting first and second coefficient groups to the corresponding multipliers by time-sharing; and adding means for adding, between corresponding multipliers, the results of multiplications by the N multipliers when the first coefficient group is inputted, and the results of multiplications by the N multipliers when the second coefficient group is inputted. The adding means comprises: a first adder group for cumulatively adding the results of multiplications by the N multipliers when the first coefficient group is inputted; a second adder group for cumulatively adding the results of multiplications by the N multipliers when the second coefficient group is inputted; and output selectors for outputting the results of additions of the first and second adder groups by time-sharing. The input data changes in its contents at a first cycle and inputs of the N selectors are switched at a second cycle, which is double the first cycle. As another option, first and second holding circuit groups may be further provided corresponding to the first and second coefficient groups, respectively, such that when the second coefficient group is inputted to the N multipliers, the results of additions by the first adder group are held in the first holding circuit group, and when the first coefficient group is inputted to the N multipliers, the results of additions by the second adder group are held in the second holding circuit group.

An operation method in a digital filter according to the present invention is an operation method in a digital filter including multiplying means for multiplying input data and predetermined coefficients and adding means for adding the multiplication results, comprising: a multiplying step for performing multiplications by N (N is a natural number) multipliers in which, of first to (2N+1)-th multiplying means, M-th (M=1 to N) multiplying means and M-th (M=N+2 to 2N+1) multiplying means are shared, and to which the input data is inputted as one of inputs; a step for inputting, by N selectors provided corresponding to the N multipliers, first and second coefficient groups to the corresponding multipliers by time-sharing; and an adding step for adding, between corresponding multipliers, the results of multiplications by the N multipliers when the first coefficient group is inputted, and the results of multiplications by the N multipliers when the second coefficient group is inputted. The adding step outputs, by time-sharing, a first addition result of cumulatively adding the results of multiplications by the N multipliers when the first coefficient group is inputted, and a second addition result of cumulatively adding the results of multiplications by the N multipliers when the second coefficient group is inputted. The input data changes in its contents at a first cycle and inputs of the N selectors are switched at a second cycle, which is double the first cycle. As another option, a holding step may be further included which uses first and second holding circuit groups provided corresponding to the first and second coefficient groups, respectively such that when the second coefficient group is inputted to the N multipliers, the results of additions by the first adder group are held in the first holding circuit group, and when the first coefficient group is inputted to the N multipliers, the results of additions by the second adder group are held in the second holding circuit group.

BRIEF DESCRIPTION OF THE DRAWING

The above and other objects, features and advantages of the present invention will become more apparent from the following detailed description when taken in conjunction with the accompanying drawings wherein.

DETAILED DESCRIPTION

Next, an embodiment of the present invention is described with reference to the accompanying drawings. In the description below, the same reference numbers are used throughout the different figures to designate the same or similar components.

Figure 1:
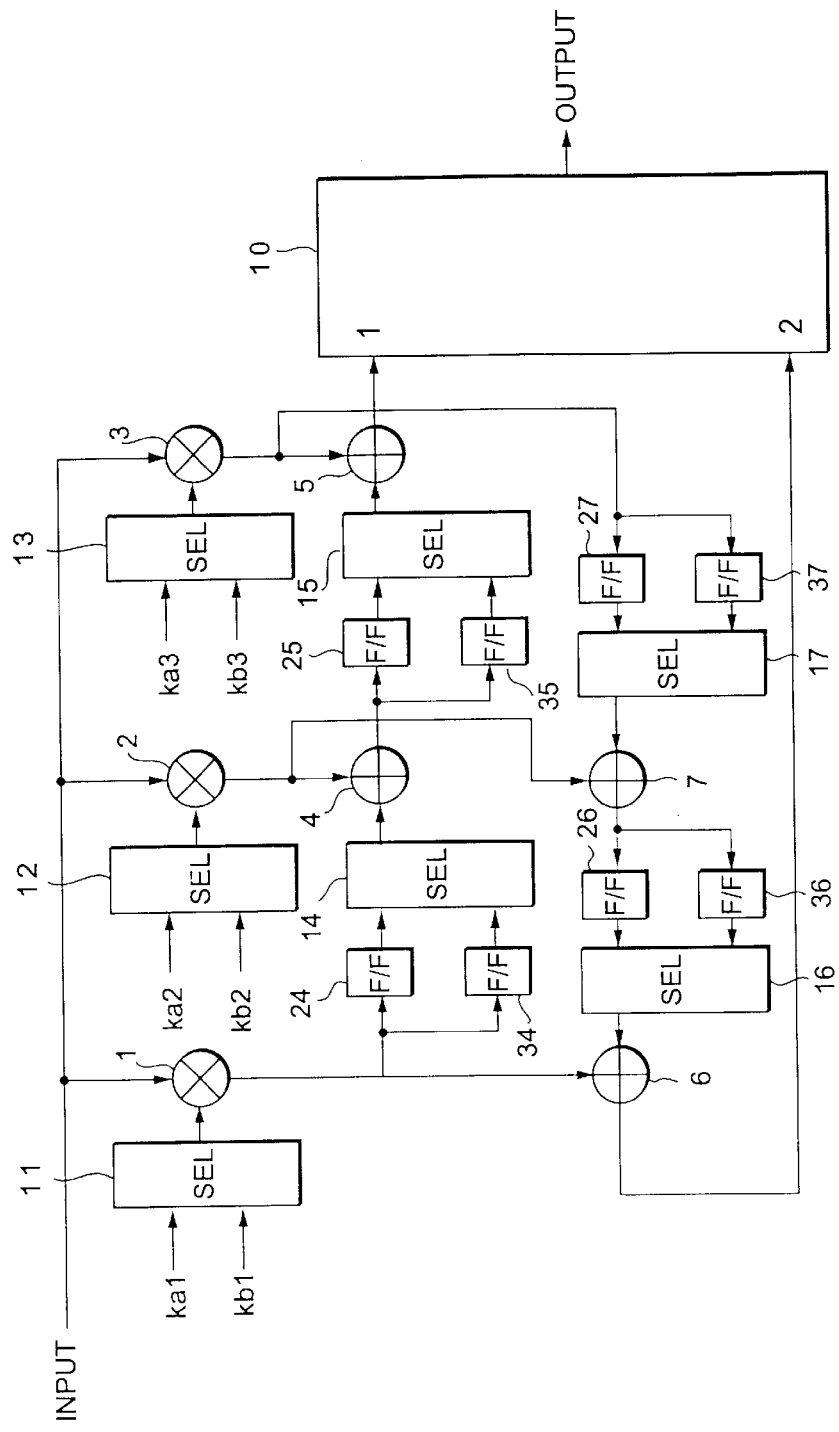
FIG. 1 is a block diagram showing the configuration of a digital filter according to one embodiment of the present invention.

FIG. 1 is a block diagram showing one embodiment of a digital filter according to the present invention, and shows a configuration of a quadruple-sampling 9-tap filter. In the figure, a signal inputted from an input terminal is inputted to multipliers 1, 2, and 3. The multipliers 1, 2, and 3 multiply tap coefficients ka1, ka2, and ka3 selected by the selectors 11, 12, and 13, respectively, and the above-described input signal.

An output signal of the multiplier 1 is inputted to F/Fs 24 and 34, and an adder 6. An output signal of the multiplier 2 is inputted to adders 4 and 7. An output signal of the multiplier 3 is inputted to an adder 5 and F/Fs 27 and 37.

At this time, the selectors 11 to 17 are set to select the position a (the selectors 11 to 13 use ka 1 to ka3, and the selectors 14 to 17 use F/Fs 24 to 27).

Inputs of the adder 4 are the output of the multiplier 2 and the output of F/F 24; inputs of the adder 5 are the output of the multiplier 3 and the output of F/F 25; inputs of the adder 6 are the output of the multiplier 1 and the output of F/F 26; and inputs of the adder 7 are the output of the multiplier 2 and the output of F/F 27;

Next, if the selectors are set to select the position b, inputs of the multiplier 1 are the input signal and a tap coefficient kb1; inputs of the multiplier 2 are the input signal and a tap coefficient kb2; and inputs of the multiplier 3 are the input signal and a tap coefficient kb3;

Since the selectors select the position b, inputs of the adder 4 are the output of the multiplier 2 and the output of F/F 34; inputs of the adder 5 are the output of the multiplier 3 and the output of F/F 35; inputs of the adder 6 are the output of the multiplier 1 and the output of F/F 36; and inputs of the adder 7 are the output of the multiplier 2 and the output of F/F 37. This is represented by the following expression.

$$Y1=D3 \times ka3+D2 \times ka2+D1 \times ka1$$

$$Y2=D3 \times kb3+D2 \times kb2+D1 \times kb1$$

$$Y3=D1 \times kb3+D2 \times kb2+D3 \times kb1$$

$$Y4=D1 \times ka3+D2 \times ka2+D3 \times ka1 \qquad (5)$$

Y1 is the output of time slot 1, Y2 is the output of time slot 2, Y3 is the output of time slot 3, and Y4 is the output of time slot 4.

Figure 6:
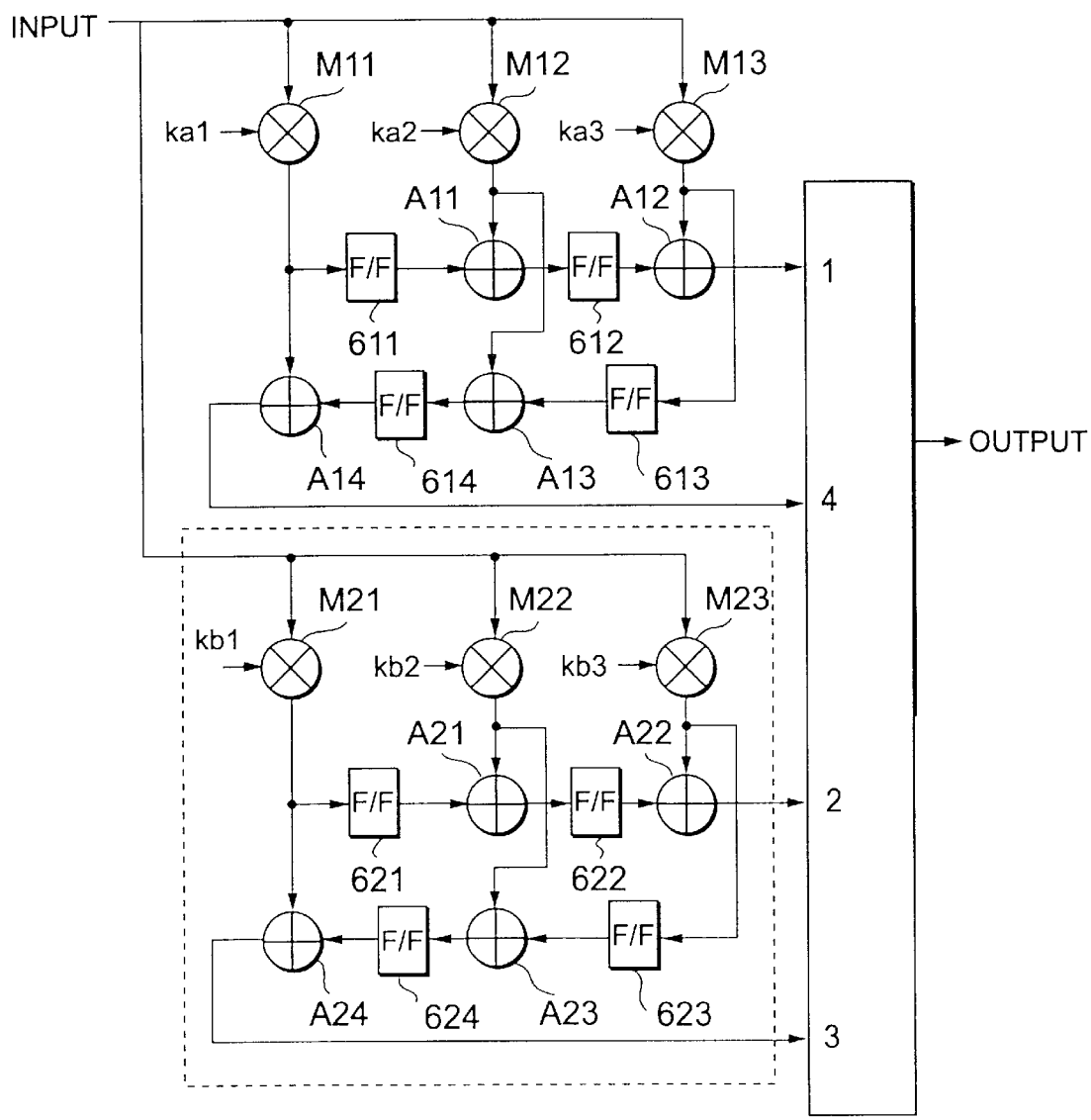
FIG. 6 is a block diagram showing an implementation of a filter obtained by sharing overlapping hardware portions in the filter of FIG. 5.

Tap coefficients ka1, ka2, ka3, kb1, kb2, and kb3, are, like FIG. 6, equal to C1+C2+C3+C4, C2+C3+C4+C5, C1, C1+C2+C3, C3+C4+C4+C5, and C1+C2, respectively.

In other words, the same output as that of the filter of FIG. 6 is obtained. Thereby, a filter that is half in size with respect to the digital filter of FIG. 6 can be realized. Furthermore, an operating speed can also be increased because the operating speed of the last selector part operating at the highest speed may be no more than half that of the digital filter of FIG. 6.

Figure 2:
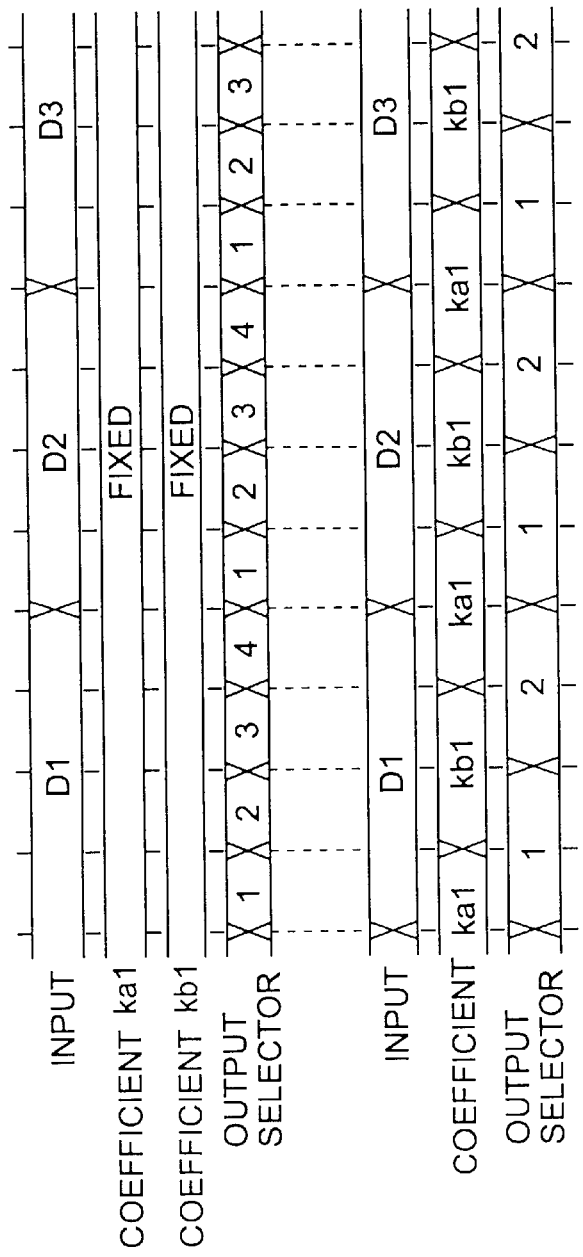
FIG. 2A is a time chart showing the operation of a conventional digital filter.
FIG. 2B is a time chart showing the operation of a digital filter of the present invention.
Figure 3:
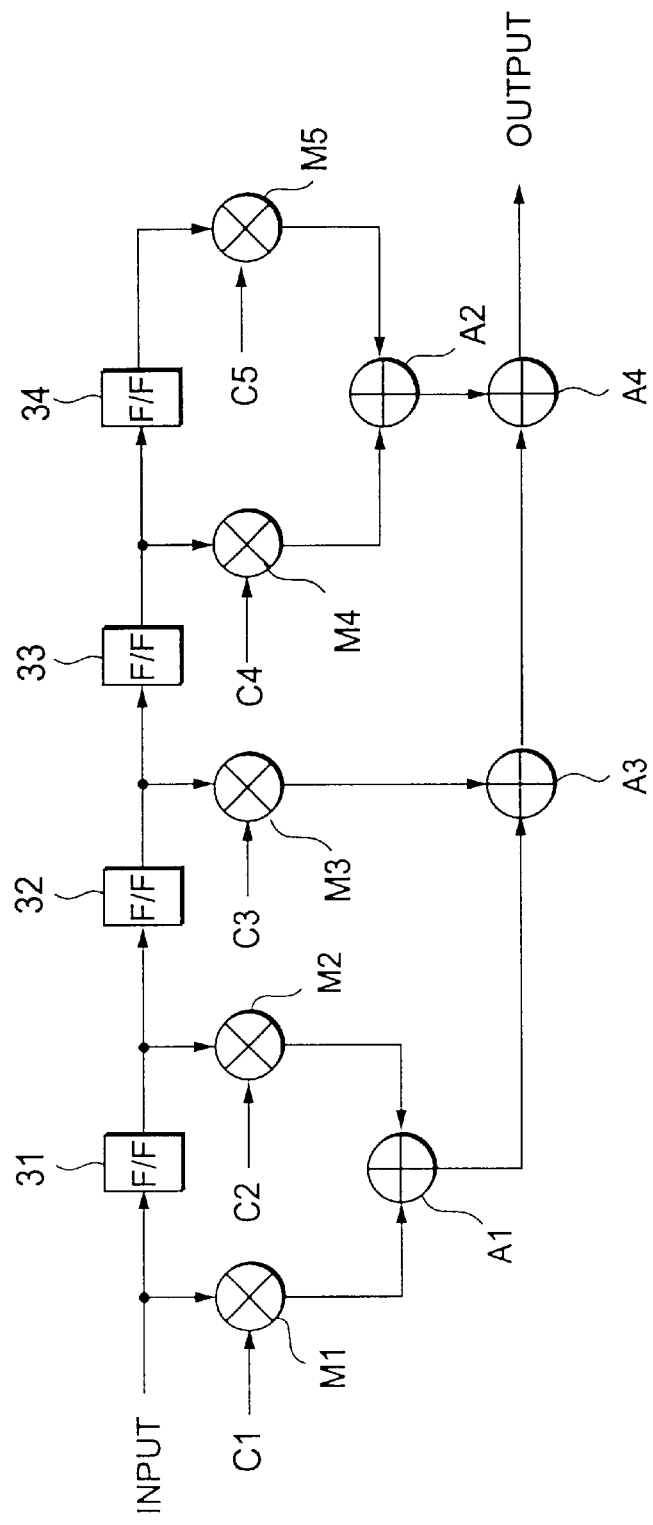
FIG. 3 is a block diagram showing the configuration of a conventional digital filter.
Figure 4:
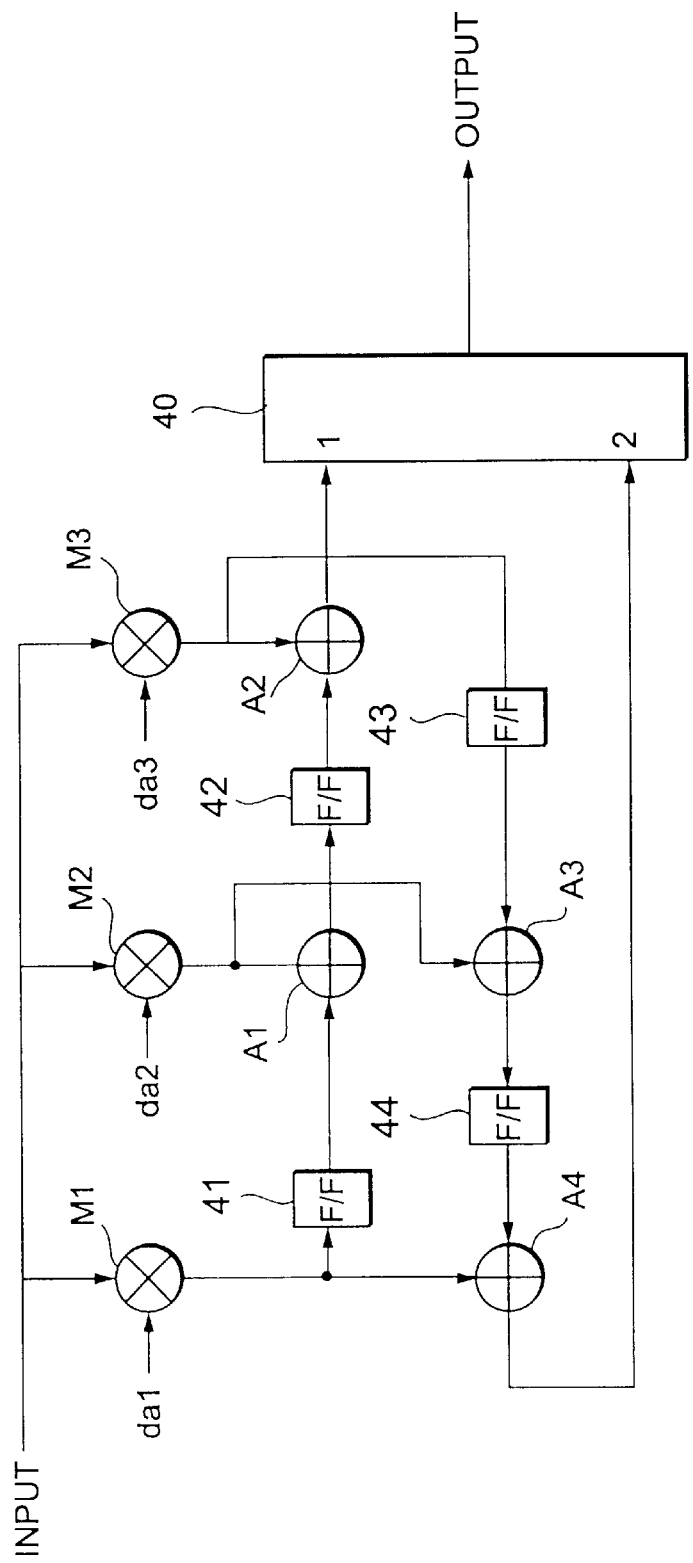
FIG. 4 is a block diagram showing an implementation of a filter that is identical in function and about half in the number of components with respect to the filter of FIG. 3.
Figure 5:
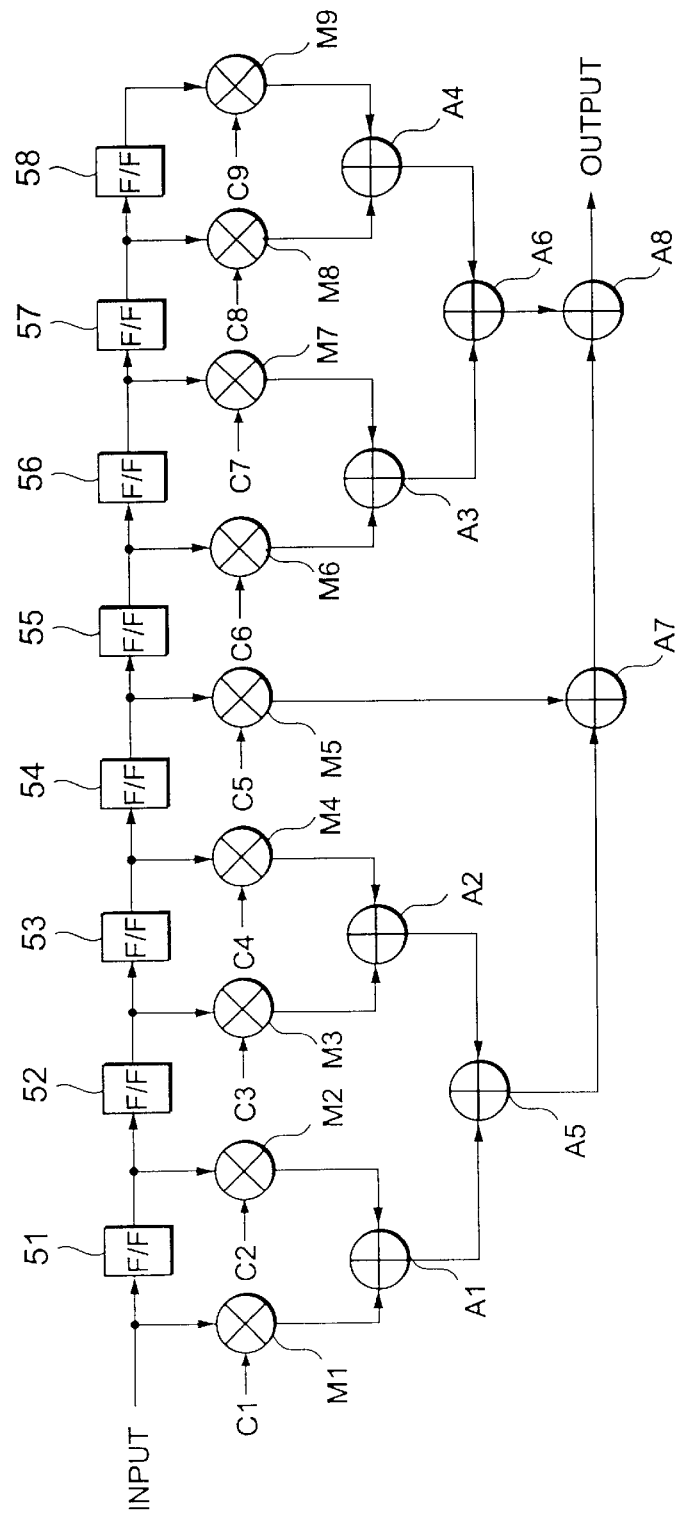
FIG. 5 is a block diagram showing the configuration of another conventional digital filter.

FIG. 2A is a time chart showing the operation of a conventional digital filter, and FIG. 2B is a time chart showing the operation of a digital filter of the present invention. Referring to FIG. 2A, in the conventional digital filter, the coefficients ka1 and kb1 are fixed since the coefficients are not changed by time-sharing. Accordingly, for each of input data D1, D2, and D3, the output of the output selector 10 changes sequentially like "1", "2", "3", and "4".

Referring to FIG. 2B, in the digital filter of this embodiment, the coefficients are changed by time-sharing so that the coefficients ka1 and kb1 are alternately inputted. For each of input data "D1", "D2", and "D3", the output of the output selector 10 alternately repeats "1" and "2". Accordingly, the operating speed of the output selector 10 of the last output stage may be half that of a conventional digital filter, so that the highest operating speed can be doubled in comparison with the conventional one.

Also for samplings other than quadruple and octuple samplings, with the same configuration, the filter can be reduced in size and increased in operating speed.

Figure 7:
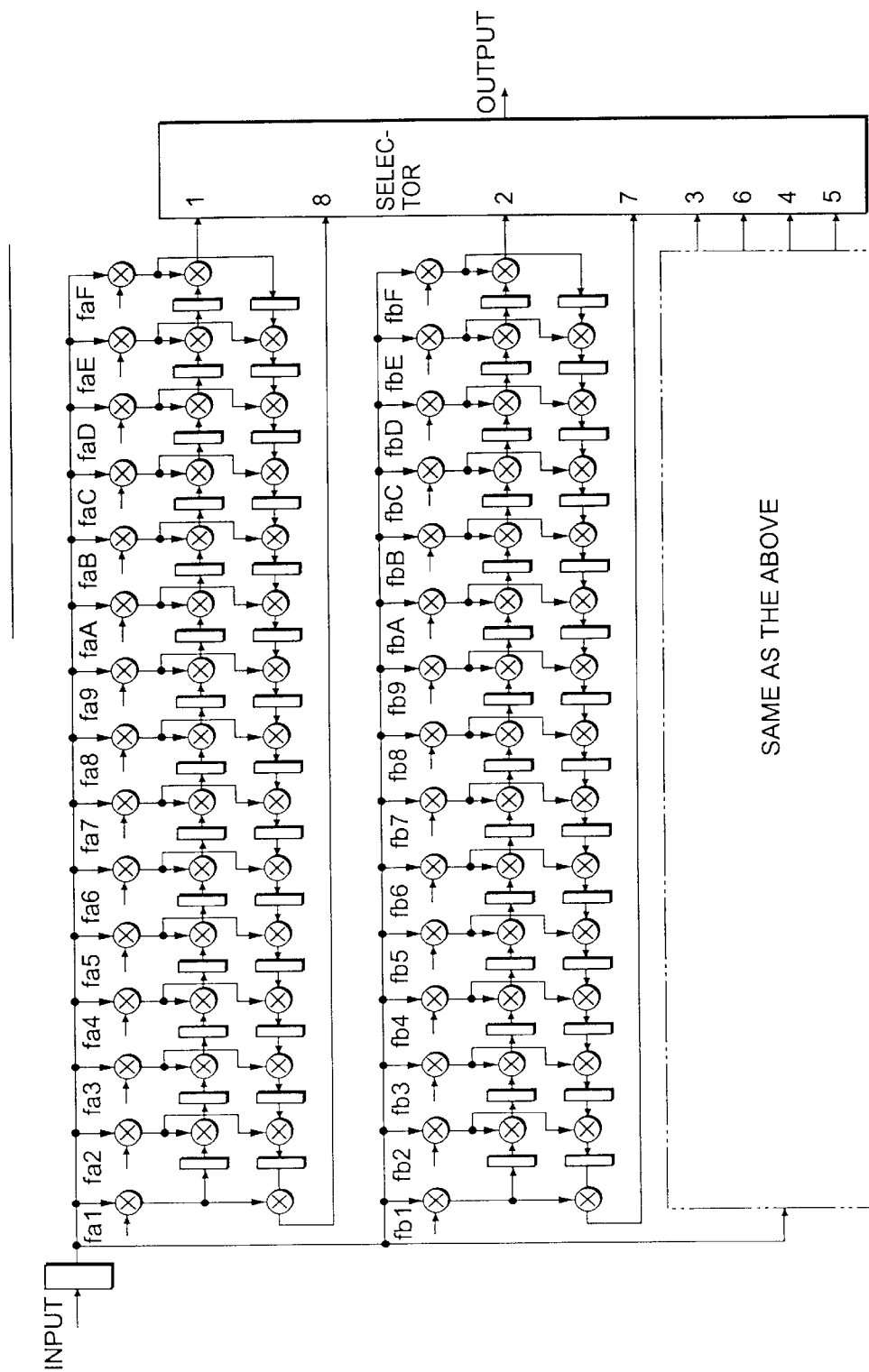
FIG. 7 is a block diagram showing a configuration of a 113-tap filter.

As has been described, the conventional filter shown in FIGS. 6 and 7 has the same configuration repeated therein, while the present invention processes tab coefficients by time-sharing and stores tab outputs, thereby reducing components. In other words, the present invention shares and controls overlapping hardware portions by time-sharing, thereby halving the number of components in comparison with the conventional filter. The operating speed of a selector of the last output stage may be half that of the conventional filter, so that the highest operating speed can be doubled with respect to the conventional one.

With such a configuration, the operating speed of multipliers can be reduced to less than half (depending on a time-sharing count) that of multipliers in normal FIR-type filters. Furthermore, the operating speed of the last selector required to operate at the highest speed can be halved with respect to filters employing conventional technologies, so that the highest operating speed can be increased.

An operation method as described below is performed in the above-described digital filter including multiplying means to multiply input data and predetermined coefficients, and adding means to add the multiplication results. Specifically, it comprises: a multiplying step for performing multiplications by N (N is a natural number) multipliers in which, of first to (2N+1)-th multiplying means, M-th (M=1 to N) multiplying means and M-th (M=N+2 to 2N+1) multiplying means are shared, and to which the input data is inputted as one of inputs; a step for inputting, by N selectors provided corresponding to the N multipliers, first and second coefficient groups to the corresponding multipliers by time-sharing; and an adding step for adding, between corresponding multipliers, the results of multiplications by the N multipliers when the first coefficient group is inputted, and the results of multiplications by the N multipliers when the second coefficient group is inputted.

The adding step outputs, by time-sharing, a first addition result of cumulatively adding the results of multiplications by the N multipliers when the first coefficient group is inputted, and a second addition result of cumulatively adding the results of multiplications by the N multipliers when the second coefficient group is inputted.

The input data changes in its contents at a first cycle and inputs of the N selectors are switched at a second cycle, which is double the first cycle.

A holding step may be further included which uses first and second holding circuit groups provided corresponding to the first and second coefficient groups, respectively such that when the second coefficient group is inputted to the N multipliers, the results of additions by the first adder group are held in the first holding circuit group, and when the first coefficient group is inputted to the N multipliers, the results of additions by the second adder group are held in the second holding circuit group.

By adopting the above-described operation method, tap coefficients are processed by time-sharing and tap outputs are stored, so that more components can be cut in comparison with conventional digital filters. The operating speed of a selector of the last output stage may be half that of conventional digital filters, so that the highest operating speed can be doubled in comparison with the conventional ones.

As has been described above, the present invention has an effect in that tap coefficients are processed by time-sharing and tap outputs are stored, whereby overlapping hardware portions can be shared and more components can be cut in comparison with conventional digital filters. Another effect is that the operating speed of a selector of the last output stage may be half that of conventional digital filters, so that the highest operating speed can be doubled in comparison with the conventional ones.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A digital filter including multiplying means for multiplying input data and predetermined coefficients and adding means for adding the multiplication results, comprising:

N (N is a natural number) multipliers in which, of first to (2N+1)-th multiplying means, M-th (M=1 to N) multiplying means and M-th (M=N+2 to 2N+1) multiplying means are shared, and to which the input data is inputted as a first input, the input data changing at a first cycle;

N selectors, provided corresponding to the N multipliers, for inputting to the N multipliers first and second coefficient groups to the corresponding multipliers by time-sharing, the coefficients changing at a second cycle double that of the first cycle;

a first adder group for cumulatively adding, between corresponding multipliers, the results of multiplications by the N multipliers when the first coefficient group is inputted;

a second adder group for cumulatively adding, between corresponding multipliers, the results of multiplications by the N multipliers when the second coefficient group is inputted; and an output selector for outputting the results of additions of the first and second adder groups by time-sharing, the results of additions being output at a third cycle double that of the first cycle, the second and third cycles being out of phase with one another.

2. The digital filter of claim 1, further including first and second holding circuit groups corresponding to the first and second coefficient groups, respectively, wherein the first coefficient group is inputted to the N multipliers, the results of additions by the first adder group are held in the first holding circuit group, and when the second coefficient group is inputted to the N multipliers, the results of additions by the second adder group are held in the second holding circuit group.

3. A operation method in a digital filter including multiplying means for multiplying input data and predetermined coefficients and adding means for adding the multiplication results, comprising:

a multiplying step for performing multiplications by N (N is a natural number) multipliers in which, of first to (2N+1)-th multiplying means, M-th (M=1 to N) multiplying means and M-th (M=N+2 to 2N+1) multiplying means are shared, and to which the input data is inputted to one of inputs;

a step for inputting, by N selectors provided corresponding to the N multipliers, first and second coefficient groups to the corresponding multipliers by time-sharing, the input data changing at a first cycle and the first and second coefficient groups changing at a second cycle double that of the first cycle;

a first adding step for cumulatively adding, between corresponding multipliers, the results of multiplications by the N multipliers when the first coefficient group is inputted;

a second adding step for cumulatively adding, between corresponding multipliers, the results of multiplications by the N multipliers when the second coefficient group is inputted; and an outputting step for outputting the results of additions of the first and second adding steps by time-sharing, the results of additions being output at a third cycle double that of the first cycle, the second and third cycles being out of phase with one another.

4. The operation method of claim 3 further including a holding step which uses first and second holding circuit groups provided corresponding to the first and second coefficient groups, respectively, wherein when the first coefficient group is inputted to the N multipliers, the results of additions by the first adder group are held in the first holding circuit group, and when the second coefficient group is inputted to the N multipliers, the results of additions by the second adder group are held in the second holding circuit group.

5. A digital filter including multiplying means for multiplying input data and predetermined coefficients and adding means for adding the multiplication results, comprising:

a plurality of multipliers to which the input data is inputted as a first input to each of said plurality of multipliers, the input data changing at a first cycle;

a first plurality of selectors corresponding to the plurality of multipliers for inputting first and second coefficient groups to a second input of corresponding multipliers by time-sharing, the coefficients changing at a second cycle double that of the first cycle;

a first adder group for cumulatively adding, between corresponding multipliers, results of multiplications when the first coefficient group is inputted;

a second adder group for cumulatively adding, between corresponding multipliers, results of multiplications when the second coefficient group is inputted; and an output selector for outputting results of additions of the first and second adder groups by time-sharing, the results of additions being output at a third cycle double that of the first cycle, the second and third cycles being out of phase with one another.

6. The digital filter of claim 5, further comprising:

first and second holding circuit groups corresponding to the first and second coefficient groups, respectively, wherein when the first coefficient group is inputted to the plurality of multipliers, results of additions by the first adder group are held in the first holding circuit group, and when the second coefficient group is inputted to the plurality of multipliers, results of additions by the second adder group are held by the second holding circuit group; and a second plurality of selectors, corresponding to complementary pairs of holding circuits from each of said first and second holding circuit groups, selectively outputting results of additions held by the first and second holding circuit groups.

7. An operation method in a digital filter including multiplying means for multiplying input data and predetermined coefficients and adding means for adding the multiplication results, comprising the steps of:

selectively inputting first and second coefficient groups;

alternately performing a plurality of multiplications the input data by the first and second coefficient groups, the input data changing at a first cycle and the first and second coefficient groups changing at a second cycle double that of the first cycle;

cumulatively adding, between corresponding ones of the plurality of multiplications, results of multiplications by the plurality of multiplications when the first coefficient group is inputted;

cumulatively adding, between corresponding ones of the plurality of multiplications, results of multiplications by the plurality of multiplications when the second coefficient group is inputted; and outputting results of cumulative additions when the first and second coefficient groups are inputted by time-sharing, the results of additions being output at a third cycle double that of the first cycle, the second and third cycles being out of phase with one another.

8. The operation method in a digital filter of claim 7, further comprising the steps of:

holding results of cumulative additions when the first and second coefficient groups are inputted by time-sharing, wherein when the first coefficient group is inputted, results of additions are held in a first holding circuit group, and when the second coefficient group is inputted, results of additions by the second adder group are held by a second holding circuit group; and selectively outputting results of additions held by the first and second holding circuit groups.

* * * * *